United States Patent
Lee et al.

(10) Patent No.: US 7,286,032 B2
(45) Date of Patent: Oct. 23, 2007

(54) RARE-EARTH-BA-CU-O SUPERCONDUCTORS AND METHODS OF MAKING SAME

(75) Inventors: Hee-Gyoun Lee, Guilderland, NY (US); Yijie Li, Niskayuna, NY (US); Venkat Selvamanickam, Wynantskill, NY (US)

(73) Assignee: Superpower, Inc., Schenectady, NY (US)

( * ) Notice: Subject to any disclaimer, the term of this patent is extended or adjusted under 35 U.S.C. 154(b) by 755 days.

(21) Appl. No.: 10/616,719

(22) Filed: Jul. 10, 2003

(65) Prior Publication Data

US 2005/0007227 A1    Jan. 13, 2005

(51) Int. Cl.
  *H01F 6/00* (2006.01)
(52) U.S. Cl. ..................... 335/216; 335/296
(58) Field of Classification Search ............... 335/216, 335/296–299
  See application file for complete search history.

(56) References Cited

U.S. PATENT DOCUMENTS

| | | |
|---|---|---|
| 5,665,682 A | 9/1997 | Okamura et al. |
| 5,972,847 A | 10/1999 | Feenstra et al. |
| 6,221,812 B1 | 4/2001 | Zhou et al. |
| 6,243,598 B1 | 6/2001 | Christiansen |
| 6,316,391 B1 * | 11/2001 | Doi et al. .................. 505/236 |
| 6,383,989 B2 | 5/2002 | Jia et al. |
| 6,569,811 B1 | 5/2003 | Shi |
| 6,569,812 B2 | 5/2003 | Watanabe et al. |
| 6,601,289 B1 | 8/2003 | Kobayashi et al. |
| 6,602,588 B1 | 8/2003 | Kwon et al. |
| 6,624,122 B1 | 9/2003 | Holesinger et al. |
| 6,635,368 B1 | 10/2003 | Agassi |
| 6,699,820 B2 | 3/2004 | Bielefeldt et al. |
| 2002/0076567 A1 | 6/2002 | Honjo et al. |
| 2003/0130129 A1 | 7/2003 | Seleznev et al. |
| 2003/0162665 A1 | 8/2003 | Rokhvarger et al. |
| 2003/0176287 A1 | 9/2003 | Kakimoto et al. |
| 2003/0211948 A1 | 11/2003 | Paranthaman et al. |
| 2004/0000421 A1 | 1/2004 | Reis et al. |
| 2004/0026118 A1 * | 2/2004 | Muroga et al. ........ 174/125.1 |
| 2004/0028954 A1 | 2/2004 | Arendt et al. |
| 2004/0053079 A1 | 3/2004 | Horibe et al. |
| 2004/0077504 A1 | 4/2004 | Adachi et al. |
| 2006/0258539 A1 * | 11/2006 | Matsumoto et al. ........ 505/100 |

* cited by examiner

*Primary Examiner*—Elvin G. Enad
*Assistant Examiner*—Bernard Rojas
(74) *Attorney, Agent, or Firm*—Larson Newman Abel Polansky & White, LLP

(57) ABSTRACT

Rare-earth-Ba—Cu—O superconductors having improved critical current density are described, as are methods of making same. These superconductors comprise a drop in $J_c$ of less than a factor of about 7 at a temperature of between about 30K to about 77K, and at a magnetic field of about 1 Tesla, when the magnetic field is applied normal to the surface of the superconductor, as compared to a $J_c$ in the presence of no magnetic field. These superconductors, when a magnetic field is applied perpendicular to the HTS surface have a peak $J_c$ that is about 50-90%, and when a magnetic field is applied in any orientation with respect to the HTS surface have a $J_c$ value that is at least about 50%, of the peak Jc that exists when the magnetic field is applied parallel to the surface of the superconductor.

46 Claims, 5 Drawing Sheets

RARE-EARTH-BA-CU-O SUPERCONDUCTORS AND METHODS OF MAKING SAME

FIELD OF THE INVENTION

The present invention relates generally to second-generation high temperature superconductors. More specifically, the present invention relates to rare-earth-Ba—Cu—O superconductors, and methods of making same. Even more specifically, the present invention relates to rare-earth-Ba—Cu—O superconductors that have minimal degradation of $J_c$ when a magnetic field is applied normal to the superconductor's surface.

BACKGROUND OF THE INVENTION

Initially, the first generation of superconductors included materials that exhibited superconducting properties at temperatures only below about 20K. These were known as low temperature superconductors. New, second-generation high temperature superconductors (HTS) are now being developed. These second-generation HTS are resistance-free conductors made of ceramic materials that exhibit superconducting properties at temperatures between about 25-130 K, which therefore require less expensive cooling systems than those needed for low temperature superconductors.

Several commercial electric power and military applications would benefit from the use of second-generation high temperature superconductors. However, there are presently several hurdles that need to be overcome before high temperature superconductors can be successfully utilized in such applications. One obstacle that needs to be overcome is that the superconducting material must be able to operate in the high magnetic fields that such devices operate at. The magnetic field that the superconducting material will experience in many such devices (i.e., commercial generators and motors, and most military applications) may be in the range of 1-5 Tesla. In a typical coated superconductor tape, when a magnetic field of 1 Tesla is applied perpendicular to the tape's surface, the critical current density decreases by a factor of about seven to about ten from its self-field value. As a result, in order to achieve 100 A/cm in a magnetic field of 1 Tesla at 77K, a critical current density of 1 MA/cm² needs to be achieved in a 1 micron thick film at 1 Tesla and 77K. Such high levels of critical current densities have not yet been demonstrated, not even in short lengths of coated superconducting tape.

In attempts to increase the performance of high temperature superconductors in high magnetic fields, some present high temperature superconductor prototype devices are being cooled to about 30K. However, cooling these devices to this low temperature increases the operational costs of the superconductor, and decreases the reliability thereof.

Other attempts to increase the performance of high temperature superconductors in high magnetic fields involve utilizing thick films. However, making thick films is a complex and expensive process, and only limited success has been achieved by utilizing this technique. Essentially, to achieve 100 A/cm at 1 Tesla and 77K, a critical current of 700 to 1000 A/cm width has to be achieved at zero applied field and 77K, and this level of performance has not yet been achieved in thick films. Furthermore, increasing the film thickness reduces manufacturing throughput and increases material costs.

Therefore, there is a need for high temperature superconductors that can operate at high temperatures and high magnetic fields. Such high performance HTS materials would ideally comprise rare-earth-Ba—Cu—O coated superconductors. It would be desirable to have such HTS materials comprise yttrium (Y) and/or heavy rare earth materials such as samarium (Sm), ytterbium (Yb), neodymium (Nd), gadolinium (Gd), europium (Eu), lanthanum (La), dysprosium (Dy), holmium (Ho), and/or mixtures thereof. It would be desirable to have such HTS materials have a superior critical current density. Ideally, these HTS would possess superior performance in the presence of a magnetic field (i.e., achieve 100 A/cm at 1 Tesla and 77K). It would be further desirable to have such HTS materials have minimal degradation of $J_c$ when a magnetic field is applied normal to the surface of the HTS. For example, it would be desirable to have such HTS materials have a drop in $J_c$ of less than a factor of about 7 at a temperature of about 30-77K, and at a magnetic field of about 1 Tesla, when the magnetic field is applied normal to the surface of the HTS. It would be yet further desirable to have such HTS materials have a peak $J_c$ when a magnetic field is applied perpendicular to the surface of the HTS that is at least about 50% of the peak $J_c$ that exists when the magnetic field is applied parallel to the surface of the HTS. It would be even further desirable to have such HTS materials have a $J_c$ value when a magnetic field is applied in any orientation with respect to the HTS surface that is at least about 50% of the peak $J_c$ that exists when the magnetic field is applied parallel to the surface of the HTS. It would be yet further desirable to have such HTS materials comprise kilometer lengths of metal tape as the substrate. It would be still further desirable to be able to make such HTS materials in a manner that allows suitably high manufacturing rates to be achieved. Many other needs will also be met by this invention, as will become more apparent throughout the remainder of the disclosure that follows.

SUMMARY OF THE INVENTION

Accordingly, the above-identified shortcomings of existing high temperature superconducting materials, and methods of making same, are overcome by embodiments of the present invention, which relates to second-generation high temperature rare-earth-Ba—Cu—O superconductors, and methods of making same. Ideally, these are coated superconductors. Embodiments of this invention may comprise HTS that can operate at high temperatures and high magnetic fields. These HTS materials may have a superior critical current density. These HTS materials may comprise kilometer lengths of metal tape as the substrate.

Embodiments of this invention comprise high temperature superconductors comprising a drop in $J_c$ of less than a factor of about 7 at a temperature of between about 30K to about 77K, and at a magnetic field of about 1 Tesla, when the magnetic field is applied normal to the surface of the superconductor, as compared to a $J_c$ in the presence of no magnetic field.

These superconductors may comprise a superconducting film on a metal tape.

In embodiments, when a magnetic field is applied perpendicular to a surface of the superconductor, these superconductors may have a peak $J_c$ that is at least about 50%, at least about 70%, at least about 90%, or at least about 50-90% of the peak $J_c$ that exists when the magnetic field is applied parallel to the surface of the superconductor.

These HTS materials may have a $J_c$ value when a magnetic field is applied in any orientation with respect to the HTS surface that is at least about 50% of the peak $J_c$ that exists when the magnetic field is applied parallel to the surface of the HTS.

Embodiments of this invention also comprise high temperature superconductors having superior performance in the presence of a magnetic field, as compared to existing HTS materials. These superconductors may comprise: a substrate; at least one buffer layer disposed on a surface of the substrate; and at least one superconducting layer disposed over the at least one buffer layer, wherein the at least one superconducting layer comprises a rare-earth-Ba—Cu—O composition, and wherein the superconductor comprises a drop in $J_c$ of less than a factor of about 7 at a temperature of between about 30K to about 77K, and at a magnetic field of about 1 Tesla, when the magnetic field is applied normal to the surface of the superconductor, as compared to a $J_c$ in the presence of no magnetic field.

Embodiments of these high temperature superconductors may comprise $RBa_2Cu_3O_{7-x}$, wherein R comprises at least one of: yttrium (Y), samarium (Sm), ytterbium (Yb), neodymium (Nd), gadolinium (Gd), europium (Eu), lanthanum (La), dysprosium (Dy), holmium (Ho), and/or mixtures thereof, and wherein x is greater than zero but less than one. Embodiments of these superconductors may also comprise at least one layer of $RBa_2Cu_3O_{7-x}$ and at least one layer of $YBa_2Cu_3O_{7-x}$, wherein R comprises at least one of: yttrium (Y), samarium (Sm), ytterbium (Yb), neodymium (Nd), gadolinium (Gd), europium (Eu), lanthanum (La), dysprosium (Dy), holmium (Ho), and/or mixtures thereof, wherein x is greater than zero but less than one.

Embodiments of this invention may comprise a single superconducting layer of a rare-earth-Ba—Cu—O material comprising at least one of yttrium (Y), samarium (Sm), ytterbium (Yb), neodymium (Nd), gadolinium (Gd), europium (Eu), lanthanum (La), dysprosium (Dy), holmium (Ho), and/or mixtures thereof. Alternatively, embodiments may comprise a layer of a rare-earth-Ba—Cu—O material comprising at least one of yttrium (Y), samarium (Sm), ytterbium (Yb), neodymium (Nd), gadolinium (Gd), europium (Eu), lanthanum (La), dysprosium (Dy), holmium (Ho), and/or mixtures thereof, sandwiched between two layers of $YBa_2Cu_3O_{7-x}$, wherein x is greater than zero and less than one.

Embodiments of this invention also comprise tape-formed oxide superconductors having minimal degradation of $J_c$ when a magnetic field is applied normal to the superconductor's surface. These superconductors may comprise: a metal tape substrate; at least one buffer layer overlying a surface of the metal tape substrate; a first superconducting layer comprising $YBa_2Cu_3O_{7-x}$ overlying the at least one buffer layer; a second superconducting layer comprising $RBa_2Cu_3O_{7-x}$ overlying the first superconducting layer, wherein R comprises at least one of: samarium (Sm), ytterbium (Yb), neodymium (Nd), gadolinium (Gd), europium (Eu), lanthanum (La), dysprosium (Dy), holmium (Ho), and/or mixtures thereof; and a third superconducting layer comprising $YBa_2Cu_3O_{7-x}$ overlying the second superconducting layer, wherein x is greater than zero and less than one.

Embodiments of this invention also comprise tape-formed oxide superconductors having minimal degradation of $J_c$ when a magnetic field is applied normal to the superconductor's surface. These superconductors may comprise: a metal tape substrate; at least one buffer layer overlying a surface of the metal tape substrate; at least one superconducting layer comprising $(YR)_1Ba_2Cu_3O_{7-x}$ overlying the at least one buffer layer; wherein R comprises at least one of: samarium (Sm), ytterbium (Yb), neodymium (Nd), gadolinium (Gd), europium (Eu), lanthanum (La), dysprosium (Dy), holmium (Ho), and/or mixtures thereof, and wherein x is greater than zero and less than one.

Embodiments of this invention may be utilized in a variety of applications, such as for example, in power cables, power transformers, power generators, and/or power grids. The power cables may comprise a conduit for passage of a cooling fluid, and the high temperature superconductor may be disposed proximate (i.e., around) the conduit. The power cables may comprise power transmission cables and/or power distribution cables. The power transformers may comprise one or more windings, wherein at least one winding comprises the high temperature superconductor. The power generator may comprise a shaft coupled to a rotor comprising at least one electromagnet comprising one or more rotor coils, and a stator comprising a conductive winding surrounding the rotor, wherein the conductive winding or at least one of the rotor coils comprises the high temperature superconductor. The power grid may comprise a power generation station comprising a power generator; a transmission substation comprising at least one power transformer for receiving power from the power generation station, and for stepping-up voltage for transmission; at least one power transmission cable for transmitting power from the transmission substation; a power substation comprising at least one power transformer for receiving power from the power transmission cables, and for stepping-down voltage for distribution; and at least one power distribution cable for distributing power to an end user.

Further features, aspects and advantages of the present invention will be more readily apparent to those skilled in the art during the course of the following description, wherein references are made to the accompanying figures which illustrate some preferred forms of the present invention, and wherein like characters of reference designate like parts throughout the drawings.

DESCRIPTION OF THE DRAWINGS

The systems and methods of the present invention are described herein below with reference to various figures, in which.

DETAILED DESCRIPTION OF THE INVENTION

Figure 1:
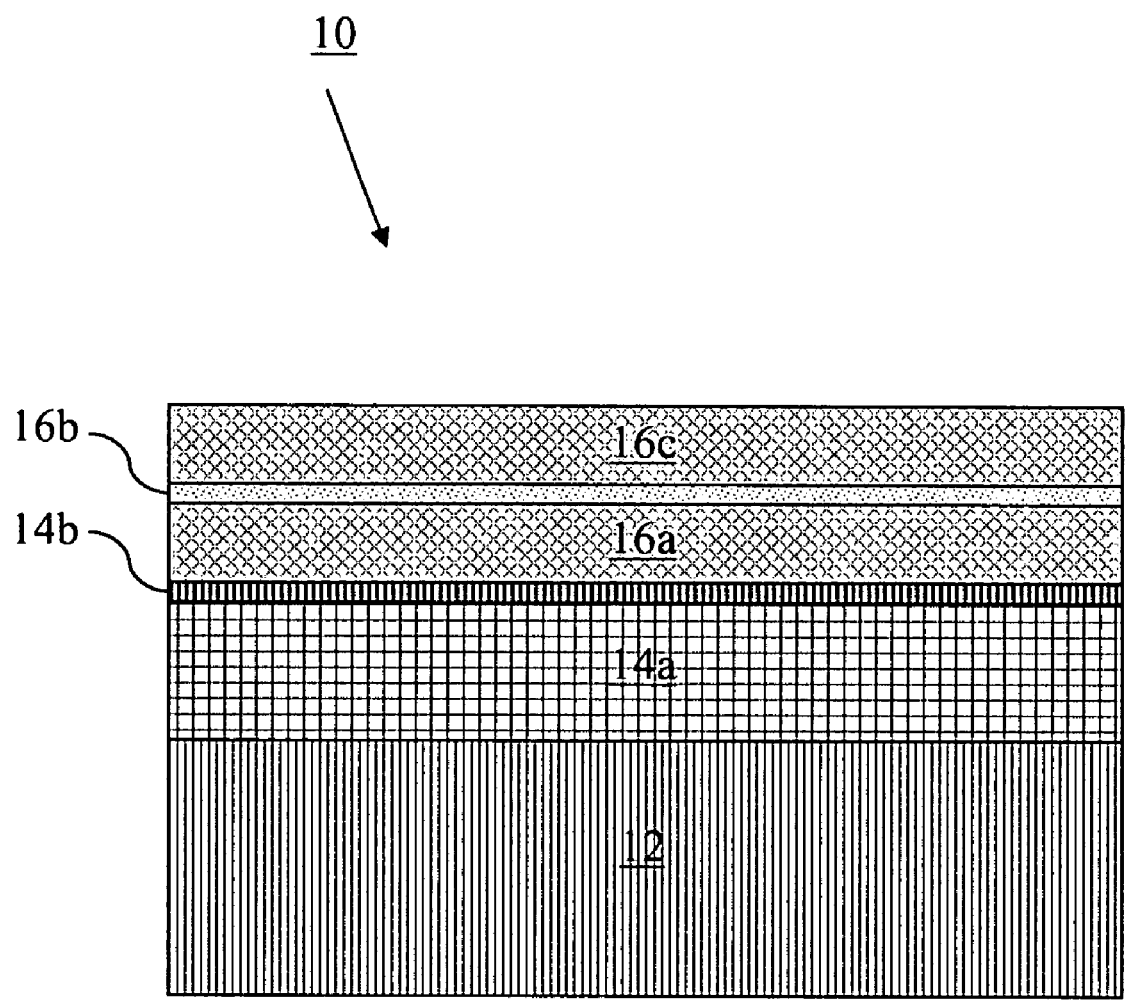
FIG. 1 is a cross sectional view of a superconducting tape showing one embodiment of this invention that comprises a layer of $SmBa_2Cu_3O_{7-x}$ sandwiched between two layers of $YBa_2Cu_3O_{7-x}$.

For the purposes of promoting an understanding of the invention, reference will now be made to some preferred embodiments of the present invention as illustrated in FIGS. 1-5 and specific language used to describe the same. The terminology used herein is for the purpose of description, not limitation. Specific structural and functional details disclosed herein are not to be interpreted as limiting, but merely as a basis for the claims as a representative basis for teaching one skilled in the art to variously employ the present invention. Any modifications or variations in the depicted support structures and methods of making same, and such further applications of the principles of the invention as illustrated herein, as would normally occur to one skilled in the art, are considered to be within the spirit of this invention.

This invention relates to second-generation high temperature rare-earth-Ba—Cu—O superconductors, and methods of making same. As previously discussed, many commercial electric power and military applications would benefit from the use of high temperature superconductors. Such applications generally require performance of about 100 A/cm in a magnetic field of 1 Tesla at 77K.

The high temperature superconductors of this invention may comprise a superconducting structure that includes a substrate, a biaxially textured buffer layer upon the substrate, and a film of superconducting material upon the buffer layer. In some embodiments, the superconductors may comprise a substrate, one or more intermediate layers, and then one or more layers of superconducting material overlying the intermediate layer(s). The intermediate layers may comprise one or more layers of the following: a buffer layer, a seed layer or stack of seed layers, a biaxially-textured layer, and/or a cap layer for a better lattice match with the superconducting layer. Additionally, there may be one or more stabilizer layers overlying the superconducting material(s).

The substrate in this invention may comprise a variety of materials, such as for example, a high strength tape-formed metal substrate having weak or no magnetism. In various embodiments, the substrate may include, but is not limited to, any suitable polycrystalline metal or metal alloy such as nickel alloy and the like. In some applications, nickel alloy may be preferred due to its high strength and temperature-resistant properties. The substrate itself may be biaxially textured using processes well known in the art, such as RABiTS. The substrate will preferably be as thin and flexible as possible, so that kilometer length wires, tapes and/or coils can be produced.

Biaxially-textured (i.e., narrow out-of plane and in-plane grain orientation distributions) buffer layers are generally used in HTS as intermediate materials between the substrate and the superconducting material. One or more biaxially-textured buffer layer may be deposited on the substrate to provide a new template upon which the superconducting layer can be grown. Buffer layers are generally necessary because if the superconductor material is deposited directly upon the metal substrate, metal may diffuse into the superconductor material and destroy its superconductivity. Almost every single metal element in the periodic table, aside from silver and gold, will destroy superconductivity. Therefore, intermediate buffer layers are needed to prevent reactions between the substrate and the superconducting material. The buffer layers themselves are stable and do not react with the superconducting material. Suitable examples of buffer materials include, but are not limited to, magnesium oxide (MgO), yttria-stabilized zirconia (YSZ), yttrium oxide ($Y_2O_3$), aluminum oxide ($Al_2O_3$), strontium ruthenate ($SrRuO_3$), strontium titanate ($SrTiO_3$), lanthanum aluminate ($LaAlO_3$), other rare-earth oxides such as cerium oxide ($CeO_2$) and gadolinium oxide ($Gd_2O_3$), and/or combinations of these or other materials. The buffer layer may be of any suitable thickness, depending upon the application of the HTS, but generally, the buffer layer thickness will be about 0.1-2 µm. Typically, a stack of different materials is used to build a buffer layer, instead of just using a single layer of one material to build a buffer layer. These buffer layers may be deposited in many ways, such as by using electron beam evaporation, sputtering, ion beam assisted deposition (IBAD), inclined substrate deposition (ISD), ion beam nano-texturing (ITEX), sol-gel, metal organic deposition (MOD), and the like, or any other suitable method.

Long lengths of superconducting films on tape (i.e., ribbon-shaped wires) are being developed as a next generation wire technology to conduct and carry large amounts of electrical current, without loss and without electrical resistance, for long periods of time over long distances. As previously discussed, such wires are generally made by depositing thin films of intermediate material(s) (i.e., buffer layers) onto ribbons of metals, followed by depositing a superconducting layer on top of the intermediate material(s).

$YBa_2Cu_3O_{7-x}$ (YBCO) is the most commonly used composition for superconductors, where x is a number greater than zero but less than one. Those skilled in the art understand that YBCO will not be superconducting above 77K unless x is close to zero. While YBCO superconductors exhibit high critical currents when there is no applied magnetic field, their performance degrades substantially in the presence of high magnetic fields, especially when the magnetic field is applied perpendicular to the surface of the superconductor.

Rare-earth-Ba—Cu—O coated superconductors, on the other hand, exhibit superior critical current in the presence of high magnetic fields, especially when the magnetic field is applied perpendicular to the surface of the superconductor. This may be due to the 3-dimensional magnetic flux pinning behavior inherent in many heavy rare-earth-Ba—Cu—O coated superconductors.

This invention utilizes rare-earth-Ba—Cu—O superconductors comprising yttrium (Y) and/or heavy rare earth elements such as neodymium (Nd), samarium (Sm), ytterbium (Yb), neodymium (Nd), gadolinium (Gd), europium (Eu), lanthanum (La), and/or dysprosium (Dy), holmium (Ho), either by themselves or in combination with other rare-earth-Ba—Cu—O superconductors.

The rare-earth-Ba—Cu—O superconductors of this invention may be produced by using multi-component rare earth elements at the same time, or by using a single rare earth element alone. For example, the rare earth portion of the superconductor could comprise just a single rare earth element, or it could comprise a combination of rare earth elements, so long as the stoichiometry of the rare-earth-Ba—Cu—O superconductor remains RE:Ba:Cu=1:2:3, where RE=rare earth element or elements. For example, it is possible to fabricate $(Y_a, Sm_b, Yb_c, Nd_d, Gd_e, Eu_f, La_g, Dy_h, Ho_i)Ba_2Cu_3O_{7-x}$, where a+b+c+d+e+f+g+h+i=1, and where x is greater than zero but less than one. Again, those skilled in the art understand that rare-earth-Ba—Cu—O superconductors will not be superconducting above 77K unless x is close to zero.

The performance properties of such superconducting films may be specifically tailored to meet a desired performance by varying the amount of each rare earth element, or by varying which individual rare earth element is used, so long as RE:Ba:Cu=1:2:3, or thereabouts, is maintained. For example, while it has been mentioned that RE:Ba:Cu=1:2:3, it is also possible for the stoichiometric ratio to vary somewhat so that RE:Ba:Cu=1:2+/−0.3:3+/−0.2, without deviating from the spirit and scope of this invention. Additionally, the processing conditions during manufacture of the superconducting film (i.e., substrate temperature, chamber pressure, gas amount and oxygen partial pressure, etc.) can be controlled so as to impart the desired performance characteristics into the final superconducting material. Furthermore, the substrate material and/or the starting precursor can be easily changed as desired, depending upon the desired performance and application for the final superconducting material.

While some embodiments of this invention may comprise a superconducting material having a single layer of a rare-earth superconducting material or mixture thereof, other embodiments may comprise a variety of different rare-earth superconducting layers arranged in a discrete fashion (i.e., one over another). For example, in one embodiment, the high temperature superconductor 10 of this invention comprises a layer of $SmBa_2Cu_3O_{7-x}$ sandwiched between two layers of $YBa_2Cu_3O_{7-x}$, wherein x is about zero to about one, as shown in FIG. 1. As shown herein, a first buffer layer 14a of YSZ (about 1.6 μm thick) is deposited on the substrate 12 (Hastelloy), then a second buffer layer 14b of $CeO_2$ (about 0.1 μm thick) is deposited thereon, followed by a first superconducting layer of $YBa_2Cu_3O_{7-x}$ 16a (about 1 μm thick), then a second superconducting layer of $SmBa_2Cu_3O_{7-x}$ 16b (about 0.2 μm thick), followed by a third superconducting layer of $YBa_2Cu_3O_{7-x}$ 16c (about 1 μm thick). While two different methods were used to deposit the superconducting layers, as described below—pulsed laser deposition (PLD) and metal organic chemical vapor deposition (MOCVD)—it will be apparent to those skilled in the art that various other processing methods could be used to form the superconducting layers of this invention, and all such methods are deemed to be within the spirit and scope of this invention. For example, these superconducting layers may be made using a variety of conventional methods including, but not limited to, evaporation including co-evaporation; electron beam evaporation; sputtering including magnetron sputtering, ion beam sputtering and ion assisted sputtering; chemical vapor deposition (CVD); metal organic chemical vapor deposition (MOCVD); pulsed laser deposition (PLD); plasma enhanced chemical vapor deposition (PECVD); molecular beam epitaxy; a sol-gel process; a solution process; and liquid phase epitaxy; or any other suitable method.

EXAMPLE ONE

In one exemplary, non-limiting embodiment, a buffer layer of yttrium stabilized zirconia (YSZ) was deposited on a substrate comprising Hastelloy via IBAD. This buffer layer was approximately 1.6 μm thick. An additional buffer layer of $CeO_2$, approximately 0.1 μm thick, was then deposited on the YSZ layer using PLD. Thereafter, a superconducting layer of $YBa_2Cu_3O_{7-x}$ was deposited over the layer of $CeO_2$, then a layer of $SmBa_2Cu_3O_{7-x}$ was deposited over the layer of $YBa_2Cu_3O_{7-x}$, and finally another layer of $YBa_2Cu_3O_{7-x}$ was deposited over the layer of $SmBa_2Cu_3O_{7-x}$, wherein x is greater than zero but less than one. These superconducting layers were also deposited via PLD. Each $YBa_2Cu_3O_{7-x}$ layer was approximately 1 μm thick, and the $SmBa_2Cu_3O_{7-x}$ layer was approximately 0.2 μm thick. The superconducting layers were deposited in a temperature range of between about 750-850° C., at a deposition rate of between about 0.5-1 micron/minute, and at an oxygen partial pressure of about 400 mTorr.

Two separate targets of $YBa_2Cu_3O_{7-x}$ and $SmBa_2Cu_3O_{7-x}$ were used to deposit the distinctive layers described in this Example. A multi-target carousel was used to house the targets, and the appropriate target was moved into place to be ablated by the excimer laser beam.

Figure 2:
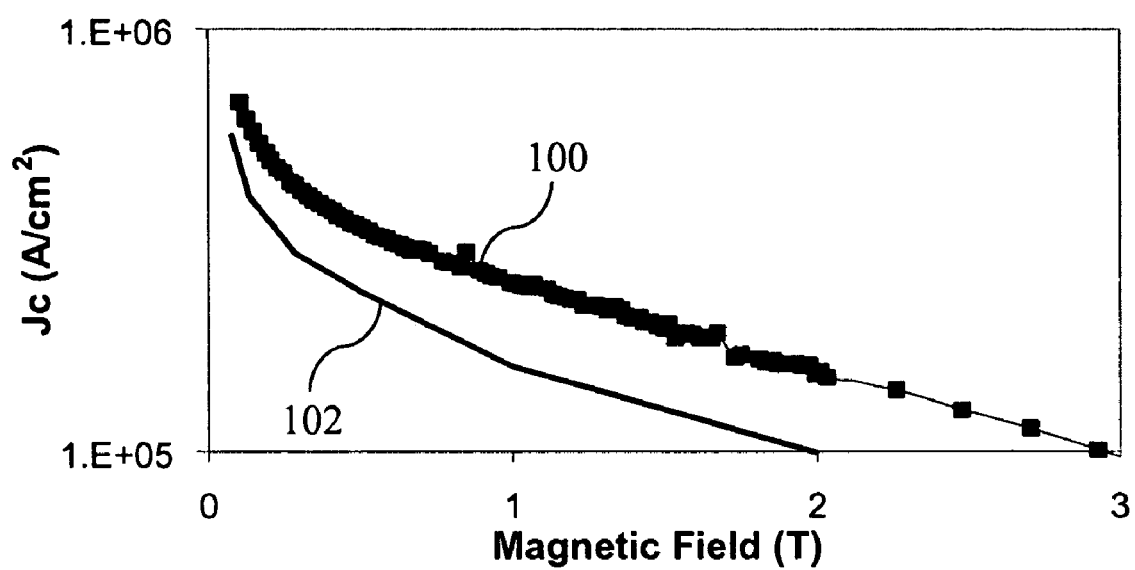
FIG. 2 is a graph showing the magnetic field dependence of $J_c$ of one embodiment of a coated superconductor of this invention as compared to the magnetic field dependence of $J_c$ of a typical second-generation coated superconductor.
Figure 3:
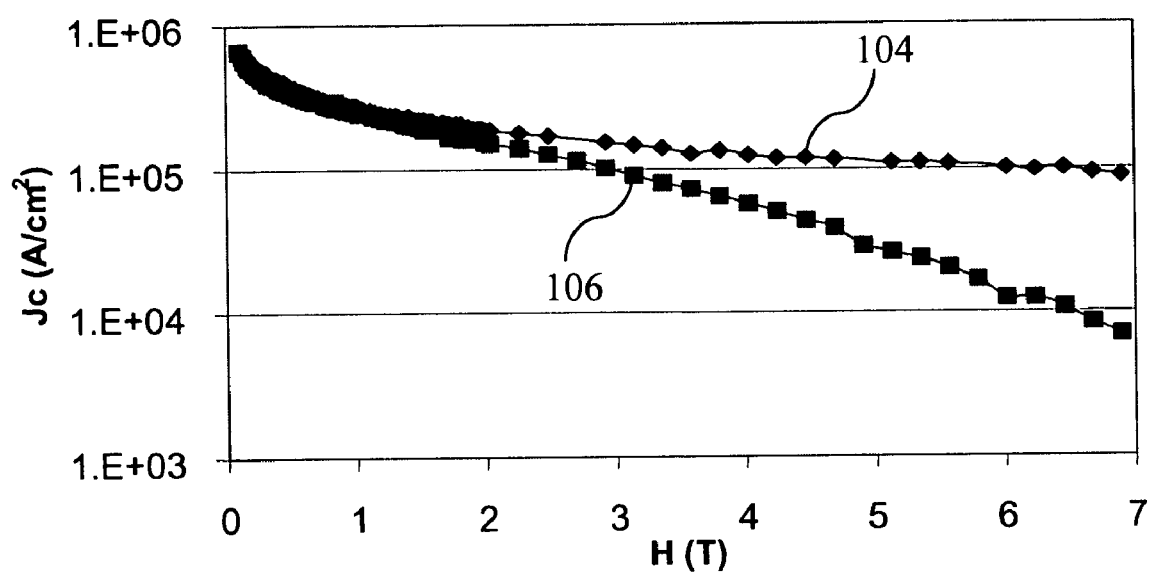
FIG. 3 is a graph comparing the magnetic field dependence of one embodiment of a coated superconductor of this invention when a magnetic field is applied parallel versus perpendicular to the surface of the superconductor.
Figure 4:
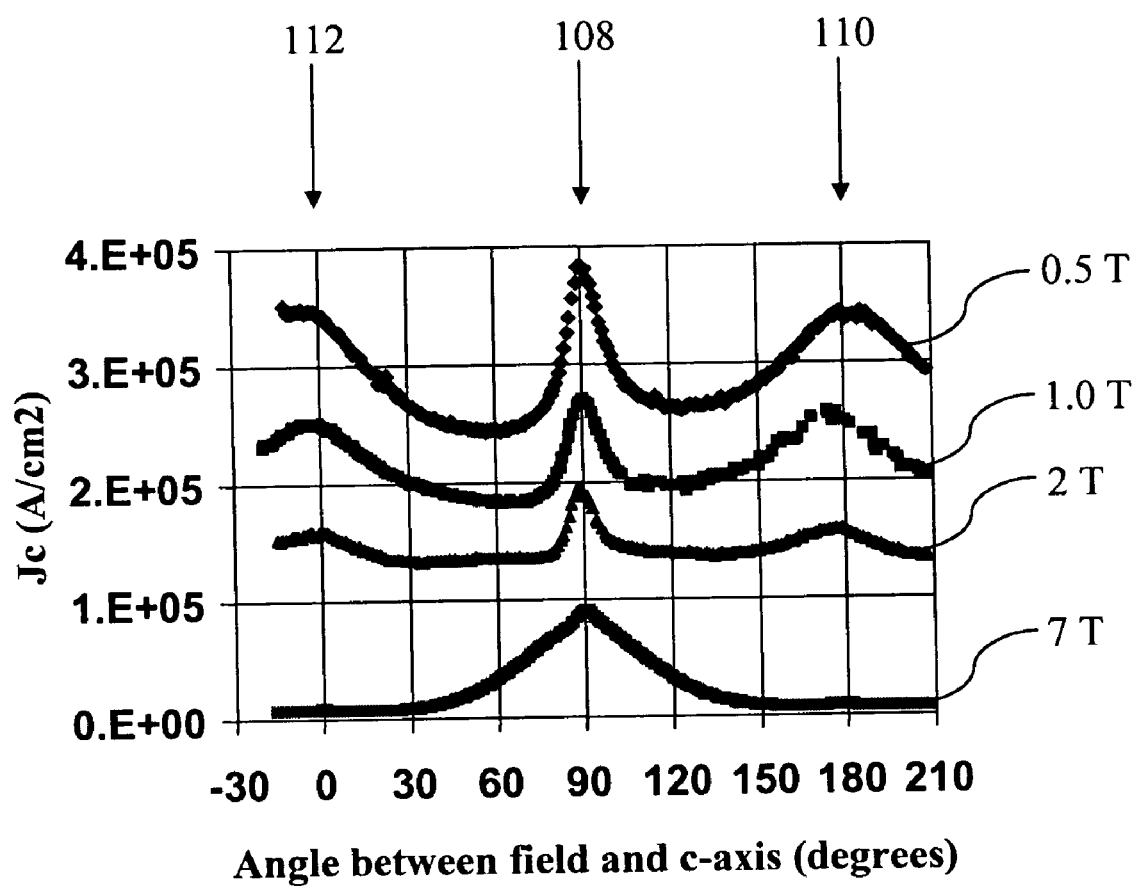
FIG. 4 is a graph showing the angular dependence of $J_c$, in various magnetic fields, in one embodiment of a coated superconductor of this invention.

Results of this rare earth discrete multilayer HTS are shown in FIGS. 2-4. Referring now to FIG. 2, there is shown a graph showing the magnetic field dependence of $J_c$ of the high temperature superconductor (HTS) of this invention 100 shown in FIG. 1, as compared to the magnetic field dependence of $J_c$ of a typical conventional second-generation coated high temperature superconductor 102. As used herein throughout, $J_c$=critical current density (a measurement of current carrying capacity measured in $A/cm^2$ at 77 K), and $I_c$=critical current (a measurement of the maximum electrical current below which a superconductor shows superconductivity at a given temperature and magnetic field). As can be seen herein, the HTS of this invention 100 performed better than the conventional HTS 102 by a factor of about 2 in the presence of a magnetic field. The drop in $J_c$ at 1 Tesla in the HTS of this invention 100 was only about a factor of 4, whereas the drop in $J_c$ at 1 Tesla in the conventional HTS 102 was about a factor of 7-10. More specifically, the HTS of this invention 100 had $J_c$=0.94 $MA/cm^2$ and $I_c$=150 A at zero magnetic field. At a magnetic field of 0.5 Tesla, applied perpendicular to the surface of the HTS, and 76K, the $J_c$ of the HTS of this invention 100 dropped by less than a factor of 3 to $J_c$=338 $kA/cm^2$ and $I_c$=54 A. At a magnetic field of 1 Tesla, applied perpendicular to the surface of the HTS, and 76K, the $J_c$ of the HTS of this invention 100 dropped by less than a factor of 4 to $J_c$=248 $kA/cm^2$ and $I_c$=40 A.

The reason for the lower drop in $J_c$ in the HTS of this invention 100 in the presence of a magnetic field can be seen in the data shown in FIG. 3. As shown herein, when the magnetic field is applied perpendicular 106 to the surface of the HTS of this invention, the $J_c$ is almost the same as when the magnetic field is applied parallel 104 to the surface of the HTS, even at magnetic fields up to almost 2 Tesla. This is highly unusual because the $J_c$ when a magnetic field of 1 Tesla is applied perpendicular to the surface of the HTS is typically expected to be about 3 times lower than the $J_c$ when the same magnetic field is applied parallel to the surface of the HTS.

The role of aniosotropy in the HTS of this invention is further explained in FIG. 4, which shows the angular dependence of $J_c$ in the HTS of this invention 10 in various magnetic fields. While it can be seen that the maximum peak $J_c$ is still observed when the magnetic field is applied parallel to the surface of the HTS 108, another strong peak also appears when the magnetic field is applied perpendicular to the surface of the HTS 110, 112. Furthermore, at both 0.5 Tesla and 1 Tesla, the $J_c$ when the magnetic field is applied perpendicular to the surface of the HTS is about 90% of the $J_c$ when the magnetic field is applied parallel to the surface of the HTS. In a typical second-generation HTS, the $J_c$ when the magnetic field is applied perpendicular to the surface of the HTS is about 30% of the $J_c$ when the magnetic field is applied parallel to the surface of the HTS. This remarkable difference in the angular dependence of $J_c$ in the presence of a magnetic field is responsible for the reduced drop in $J_c$ in the HTS of this invention in the presence of a magnetic field.

It can be further seen in FIG. 4 that, in this embodiment of the HTS of this invention, the minimum $J_c$ when the magnetic field is applied in any orientation with respect to the surface of the HTS is about 65% of the $J_c$ when the magnetic field is applied parallel to the surface of the HTS.

In a typical second-generation HTS, the minimum $J_c$ when the magnetic field is applied in any orientation with respect to the surface of the HTS is generally about 30% of the $J_c$ when the magnetic field is applied parallel to the surface of the HTS.

EXAMPLE TWO

In another embodiment, a buffer layer of YSZ was deposited on a substrate comprising Hastelloy via IBAD. This buffer layer was approximately 1.6 μm thick. Thereafter, an approximately 200 nm-thick $CeO_2$ film was deposited onto the YSZ film via PLD at 800° C. Thereafter, a superconducting layer of $Y_{0.9}Sm_{0.1}Ba_2Cu_3O_{7-x}$ film was deposited onto the $CeO_2$ layer via MOCVD at chamber pressure=1.6 Torr and $PO_2$=1 Torr, wherein x is greater than zero but less than one.

The $Y_{0.9}Sm_{0.1}Ba_2Cu_3O_{7-x}$ film was prepared by using a 10% Sm-90% Y liquid precursor concentration. The concentration of the liquid precursor was controlled by mixing a Sm and Y precursor having a ratio of Y:Sm=9:1 into a fixed amount of a Ba and Cu precursor mixture so that the composition of the superconducting film could be easily changed by changing the composition of the liquid precursor. The liquid precursor was fed into the reaction chamber from outside of the chamber, and therefore, the composition of the superconducting film could be controlled in-situ during processing.

Figure 5:
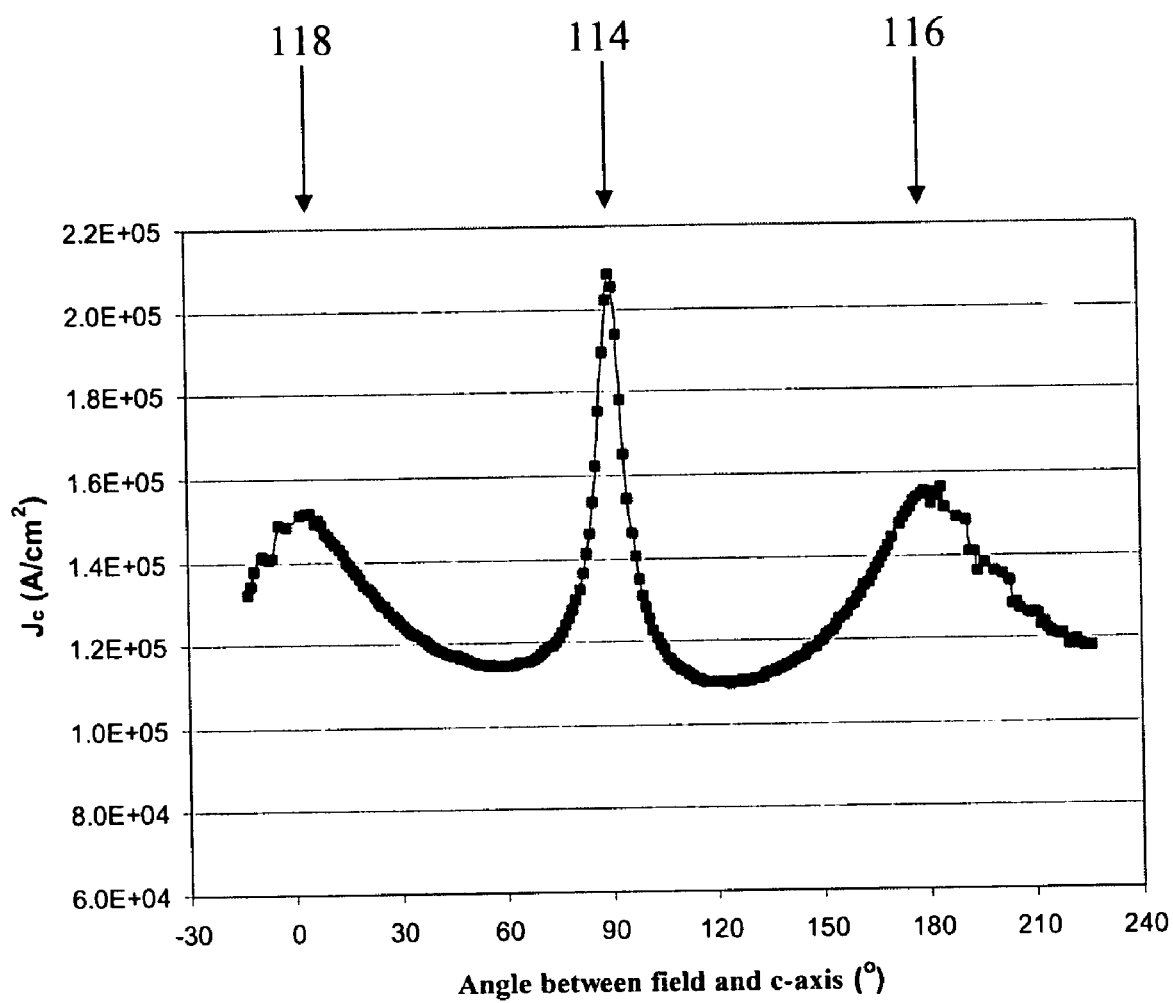
FIG. 5 is a graph showing the angular dependence of $J_c$, in a magnetic field, in another embodiment of a coated superconductor of this invention.

The angular dependence of $J_c$ in a magnetic field of this HTS is shown in FIG. 5. As seen herein, a peak in $J_c$ is observed when the magnetic field is applied perpendicular to the surface of the HTS 116, 118. The intensity of this peak is about 70% of the peak when the magnetic field is applied parallel to the surface of the HTS 114. While this 70% peak of the HTS made by the MOCVD process (Example Two) is not as intense as the 90% peak of the HTS made by the PLD process (Example One), it is still much better than the 30% $J_c$ value seen in typical second-generation HTS. The difference in the intensity of the peak in $J_c$ when the magnetic field is applied perpendicular to the surface of the HTS is not because of the difference in the process itself (MOCVD vs. PLD), since other results have shown that the intensity of the peak can be varied within each process.

It can be further seen in FIG. 5 that, in this embodiment of the HTS of this invention, the minimum $J_c$ when the magnetic field is applied in any orientation with respect to the surface of the HTS is about 50% of the $J_c$ when the magnetic field is applied parallel to the surface of the HTS. As previously noted, in a typical second-generation HTS, the minimum $J_c$ when the magnetic field is applied in any orientation with respect to the surface of the HTS is generally about 30% of the $J_c$ when the magnetic field is applied parallel to the surface of the HTS.

While two very different processes (PLD and MOCVD) were used to make two different embodiments of the HTS of this invention, the results show that both methods are capable of producing high quality superconducting tape. Without in any way limiting the scope of this invention, it is believed that using heavy rare earths in the structure may be the reason for the improved performance of these HTS in the presence of magnetic fields.

As described above, the second-generation high temperature rare-earth-Ba—Cu—O superconductors of this invention allow superconductors having minimal degradation of $J_c$ in the presence of a magnetic field to be realized. Advantageously, the superconductors of this invention show tremendous promise for commercial and military uses. These HTS may be fabricated into kilometer-length cables, tapes or coils in a rapid mass production environment. Many other advantages will also be apparent to those skilled in the relevant art.

The high temperature superconductors of this invention may be used in various applications, such as for example, power cables, power transformers, power generators, and/or power grids. The power cables may comprise a conduit for passage of a cooling fluid, wherein the high temperature superconductor is disposed proximate (i.e., around) the conduit. The power cables may comprise power transmission cables and/or a power distribution cables. The power transformers may comprise one or more windings, wherein at least one winding comprises the high temperature superconductor. The power generators may comprise a shaft coupled to a rotor comprising at least one electromagnet comprising one or more rotor coils, and a stator comprising a conductive winding surrounding the rotor, wherein the conductive winding or at least one of the rotor coils comprises the high temperature superconductor. The power grids may comprise a power generation station comprising a power generator; a transmission substation comprising at least one power transformer for receiving power from the power generation station, and for stepping-up voltage for transmission; at least one power transmission cable for transmitting power from the transmission substation; a power substation comprising at least one power transformer for receiving power from the power transmission cables, and for stepping-down voltage for distribution; and at least one power distribution cable for distributing power to an end user.

Various embodiments of this invention have been described in fulfillment of the various needs that the invention meets. It should be recognized that these embodiments are merely illustrative of the principles of various embodiments of the present invention. Numerous modifications and adaptations thereof will be apparent to those skilled in the art without departing from the spirit and scope of the present invention. For example, while only a couple RE-Ba—Cu—O embodiments were described herein in detail, numerous other embodiments are also possible, and all are deemed to be within the spirit and scope of this invention. Furthermore, while coated superconductors have been described herein, bulk superconductors may exhibit the desired superior performance in the presence of a magnetic field as well, and as such, are also deemed to be within the spirit and scope of this invention. Thus, it is intended that the present invention cover all suitable modifications and variations as come within the scope of the appended claims and their equivalents.

What is claimed is:

1. A high temperature superconductor comprising a drop in $J_c$ of less than a factor of about 7 at a temperature of between about 30K to about 77K, and at a magnetic field of about 1 Tesla, when the magnetic field is applied normal to the surface of the superconductor, as compared to a $J_c$ in the presence of no magnetic field, and comprising a $J_c$ when a magnetic field is applied perpendicular to a surface of the superconductor, wherein $J_c$ when a magnetic field is applied perpendicular to the surface of the superconductor is at least about 50% of the $J_c$ that exists when the magnetic field is applied parallel to the surface of the superconductor.

2. The high temperature superconductor of claim 1, wherein the superconductor comprises $RBa_2Cu_3O_{7-x}$, where R comprises at least one of: ytterium samarium (Sm), ytterbium (Yb), neodymium (Nd), gadolinium (Gd), europium (Eu), lanthanum (La), dysprosium (Dy), holminum (Ho), and mixtures thereof.

3. The high temperature superconductor of claim 2, wherein x is greater than zero but less than one.

4. The high temperature superconductor of claim 1, wherein the superconductor comprises a superconducting film on a metal tape.

5. A high temperature superconductor comprising a drop in $J_c$ of less than a factor of about 7 at a temperature of between about 30K to about 77K, and at a magnetic field of about 1 Tesla, when the magnetic field is applied normal to the surface of the superconductor, as compared to a $J_c$ in the presence of no magnetic field, and comprising a $J_c$ when a magnetic field is applied perpendicular to a surface of the superconductor, wherein, when a magnetic field is applied in any orientation with respect to a surface of the superconductor, the superconductor has a $J_c$ value that is at least about 50% of the $J_c$ that exists when the magnetic field is applied parallel to the surface of the superconductor.

6. A high temperature superconductor comprising a drop in $J_c$ of less than a factor of about 7 at a temperature of between about 30K to about 77K, and at a meanetic field of about 1 Tesla, when the magnetic field is applied normal to the surface of the superconductor, as compared to a $J_c$ in the presence of no magnetic field, and comprising a $J_c$ when a magnetic field is applied perpendicular to a surface of the superconductor, wherein the superconductor comprises at least one layer of $RBa_2Cu_3O_{7-x}$ and at least one layer of $YBa_2Cu_3O_{7-x}$, wherein R comprises at least one of: ytterium (Y), samarium (Sm), ytterbium (Yb), neodymium (Nd), gadolinium (Gd), europium (Eu), lanthanum (La), dysprosium (Dy), holminum (Ho), and mixtures thereof, and wherein x is greater than zero but less than one.

7. The high temperature superconductor of claim 1, wherein the high temperature superconductor is utilized in at least one of: a power cable, a power transformer, a power generator, and a power grid.

8. The high temperature superconductor of claim 7, wherein the power cable comprises a conduit for passage of a cooling fluid, and wherein the high temperature superconductor is disposed proximate the conduit.

9. The high temperature superconductor of claim 8, wherein the power cable comprises at least one of: a power transmission cable and a power distribution cable.

10. The high temperature superconductor of claim 7, wherein the power transformer comprises one or more windings, wherein at least one winding comprises the high temperature superconductor.

11. The high temperature superconductor of claim 7, wherein the power generator comprises:
 a shaft coupled to a rotor comprising at least one electromagnet comprising one or more rotor coils, and
 a stator comprising a conductive winding surrounding the rotor,
 wherein the conductive winding or at least one of the rotor coils comprises the high temperature superconductor.

12. The high temperature superconductor of claim 7, wherein the power grid comprises:
 a power generation station comprising a power generator;
 a transmission substation comprising at least one power transformer for receiving power from the power generation station, and for stepping-up voltage for transmission;
 at least one power transmission cable for transmitting power from the transmission substation;
 a power substation comprising at least one power transformer for receiving power from the power transmission cables, and for stepping-down voltage for distribution; and
 at least one power distribution cable for distributing power to an end user.

13. A high temperature superconductor baying superior performance in the presence of a magnetic field, the superconductor comprising:
 a substrate;
 at least one buffer layer disposed on a surface of the substrate;
 at least one superconducting layer disposed over the at least one buffer layer,
 wherein the at least one superconducting layer comprises a rare-earth-Ba—Cu—O composition, and wherein the superconductor comprises a drop in $J_c$ of less than a factor of about 7 at a temperature of between about 30K to about 77K, and at a magnetic field of about 1 Tesla, when the magnetic field is applied normal to the surface of the superconductor, as compared to a $J_c$ in the presence of no magnetic field, and comprises a $J_c$ when a magnetic field is applied perpendicular to a surface of the superconductor,
 wherein $J_c$ when a magnetic field is applied perpendicular to the surface of the superconductor is at least about 50% of the $J_c$ that exists when the magnetic field is applied parallel to the surface of the superconductor.

14. The high temperature superconductor of claim 13, wherein the rare-earth-Ba—Cu—O composition comprises at least one of: ytterium (Y), samarium (Sm), ytterbium (Yb), neodymium (Nd), gadolinium (Gd), europium (Eu), lanthanum (La), dysprosium (Dy), holmium (Ho), and mixtures thereof.

15. The high temperature superconductor of claim 13, wherein the at least one superconducting layer comprises a single layer of a rare-earth-Ba—Cu—O material comprising at least one of ytterium (Y), samarium (Sm), ytterbium (Yb), neodymium (Nd), gadolinium (Gd), europium (Eu), lanthanum (La), dysprosium (Dy), holmium (Ho), and mixtures thereof.

16. A high temperature superconductor having superior performance in the presence of a magnetic field, the superconductor comprising:
 a substrate;
 at least one buffer layer disposed on a surface of the substrate;
 at least one superconducting layer disposed over the at least one buffer layer,
 wherein the at least one superconducting layer con-rnrises a rare-earth-Ba—Cu—O composition, and wherein the superconductor comprises a drop in $J_c$, of less than a factor of about 7 at a temperature of between about 30K to about 77K, and at a magnetic field of about 1 Tesla, when the magnetic field is applied normal to the surface of the superconductor, as compared to a $J_c$ in the presence of no magnetic field, and comprises a $J_c$ when a magnetic field is applied perpendicular to a surface of the superconductor,
 wherein the at least one superconducting layer comprises a layer of a rare-earth-Ba—Cu—O material comprising at least one of ytterium (Y), samarium (Sm), ytterbium (Yb), neodymium (Nd), gadolinium (Gd), europium (Eu), lanthanum (La), dysprosium (Dy), holmium (Ho), and mixtures thereof, sandwiched between two layers of $YBa_2Cu_3O_{7-x}$, wherein x is greater than zero and less than one.

17. A high temperature superconductor having superior performance in the presence of a magnetic field, the superconductor comprising:
  a substrate;
  at least one buffer layer disposed on a surface of the substrate;
  at least one superconducting layer disposed over the at least one buffer layer,
  wherein the at least one superconducting layer comprises a rare-earth-Ba—Cu—O composition, and wherein the superconductor comprises a drop in $J_c$ of less than a factor of about 7 at a temperature of between about 30K to about 77K, and at a magnetic field of about 1 Tesla, when the magnetic field is applied normal to the surface of the superconductor, as compared to a $J_c$ the presence of no magnetic field, and comprises a $J_c$ when a magnetic field is applied perpendicular to a surface of the superconductor,
  wherein $J_c$ when a magnetic field is applied perpendicular to a surface of the superconductor is at least about 90% of the $J_c$ that exists when the magnetic field is applied parallel to the surface of the superconductor.

18. A high temperature superconductor having superior performance in the presence of a magnetic field, the superconductor comprising:
  a substrate;
  at least one buffer layer disposed on a surface of the substrate;
  at least one superconducting layer disposed over the at least one buffer layer,
  wherein the at least one superconducting layer comprises a rare-earth-Ba—Cu—O composition, and wherein the superconductor comprises a drop in $J_c$ of less than a factor of about 7 at a temperature of between about 30K to about 77K, and at a magnetic field of about 1 Tesla, when the magnetic field is applied normal to the surface of the superconductor, as compared to a $J_c$ in the presence of no magnetic field, and comprises a $J_c$ when a magnetic field is applied perpendicular to a surface of the superconductor,
  wherein $J_c$ when a magnetic field is applied perpendicular to a surface of the superconductor is at least about 70% of the $J_c$ that exists when the magnetic field is applied parallel to the surface of the superconductor.

19. A high temperature superconductor having superior performance in the presence of a magnetic field, the superconductor comprising:
  a substrate;
  at least one buffer layer disposed on a surface of the substrate;
  at least one superconducting layer disposed over the at least one buffer layer,
  wherein the at least one superconducting layer comprises a rare-earth-Ba—Cu—O composition, and wherein the superconductor comprises a drop in $J_c$ of less than a factor of about 7 at a tempenture of between about 30K to about 77K, and at a magnetic field of about 1 Tesla, when the magnetic field is applied normal to the surface of the superconductor, as compared to a $J_c$ in the presence of no magnetic field, and comprises a $J_c$ when a magnetic field is applied perpendicular to a surface of the superconductor,
  wherein, when a magnetic field is applied in any orientation with respect to a surface of the superconductor, the superconductor has a $J_c$ value that is at least about 50% of the $J_c$ that exists when the magnetic field is applied parallel to the surface of the superconductor.

20. The high temperature superconductor of claim 13, wherein the substrate comprises a superconducting film on a metal tape.

21. The high temperature superconductor of claim 13, wherein the high temperature superconductor is utilized in at least one of: a power cable, a power transformer, a power generator, and a power grid.

22. The high temperature superconductor of claim 21, wherein the power cable comprises a conduit for passage of a cooling fluid, and wherein the high temperature superconductor is disposed proximate the conduit.

23. The high temperature superconductor of claim 22, wherein the power cable comprises at least one of: a power transmission cable and a power distribution cable.

24. The high temperature superconductor of claim 21, wherein the power transformer comprises one or more winding, wherein at least one winding comprises the high temperature superconductor.

25. The high temperature superconductor of claim 21, wherein the power generator comprises:
  a shaft coupled to a rotor comprising at least one electromagnet comprising one or more rotor coils, and
  a stator comprising a conductive winding surrounding the rotor,
  wherein the conductive winding or at least one of the rotor coils comprises the high temperature superconductor.

26. The high temperature superconductor of claim 21, wherein the power grid comprises:
  a power generation station comprising a power generator;
  a transmission substation comprising at least one power transformer for receiving power from the power generation station, and for stepping-up voltage for transmission;
  at least one power transmission cable for transmitting power from the transmission substation;
  a power substation comprising at least one power transformer for receiving power from the power transmission cables, and for stepping-down voltage for distribution; and
  at least one power distribution cable for distributing power to an end user.

27. A tape-formed oxide superconductor having minimal degradation of $J_c$ when a magnetic field is applied normal to the superconductor's surface, the superconductor comprising:
  a metal tape substrate;
  at least one buffer layer overlying a surface of the metal tape substrate;
  a first superconducting layer comprising $YBa_2Cu_3O_{7-x}$ overlying the at least one buffer layer;
  a second superconducting layer comprising $RBa_2Cu_3O_{7-x}$ overlying the first superconducting layer, wherein R comprises at least one of: samarium (Sm), ytterbium (Yb), neodymium (Nd), gadolinium (Gd), europium (Eu), lanthanum (La), dysprosium (Dy), holmium (Ho), and mixtures thereof;
  and a third superconducting layer comprising $YBa_2Cu_3O_{7-x}$ overlying the second superconducting layer,
  wherein x is greater than zero and Less than one, and wherein when a magnetic field is applied perpendicular to a surface of the tape-formed oxide superconductor, the tape-formed oxide superconductor has a peak $J_c$.

28. The tape-formed oxide superconductor of claim 27, wherein said peak $J_c$ when a magnetic field is applied perpendicular to a surface of the tape-formed oxide superconductor is about 50-90% of the peak $J_c$ that exists when the magnetic field is applied parallel to the surface of the tape-formed oxide superconductor.

29. The high temperature superconductor of claim 27, wherein, when a magnetic field is applied in any orientation with respect to a surface of the superconductor, the superconductor has a $J_c$ value that is at least about 50% of the peak $J_c$ that exists when the magnetic field is applied parallel to the surface of the superconductor.

30. The tape-formed oxide superconductor of claim 27, wherein the tape-formed oxide superconductor comprises a drop in $J_c$ of less than a factor of about 7 at a temperature of between about 30K to about 77K, and at a magnetic field of about 1 Tesla, when the magnetic field is applied normal to the surface of the tape-formed oxide superconductor, as compared to a $J_c$ in the presence of no magnetic field.

31. The high temperature superconductor of claim 27, wherein the high temperature superconductor is utilized in at least one of: a power cable, a power transformer, a power generator, and a power grid.

32. The high temperature superconductor of claim 31, wherein the power cable comprises a conduit for passage of a cooling fluid, and wherein the high temperature superconductor is disposed proximate the conduit.

33. The high temperature superconductor of claim 32, wherein the power cable comprises at least one of: a power transmission cable and a power distribution cable.

34. The high temperature superconductor of claim 31, wherein the power transformer comprises one or more windings, wherein at least one winding comprises the high temperature superconductor.

35. The high temperature superconductor of claim 31, wherein the power generator comprises:
  a shaft coupled to a rotor comprising at least one electromagnet comprising one or more rotor coils, and
  a stator comprising a conductive winding surrounding the rotor,
  wherein the conductive winding or at least one of the rotor coils comprises the high temperature superconductor.

36. The high temperature superconductor of claim 31, wherein the power grid comprises;
  a power generation station comprising a power generator;
  a transmission substation comprising at least one power transformer for receiving power from the power generation station, and for stepping-up voltage for transmission;
  at least one power transmission cable for transmitting power from the transmission substation;
  a power substation comprising at least one power transformer for receiving power from the power transmission cables, and for stepping-down voltage for distribution; and
  at least one power distribution cable for distributing power to an end user.

37. A tape-formed oxide superconductor having minimal degradation of $J_c$ when a magnetic field is applied normal to the superconductor's surface, the superconductor comprising:
  a metal tape substrate;
  at least one buffer layer overlying a surface of the metal tape substrate; at least one superconducting layer comprising $(Y)_1Ba_2Cu_3O_{7-x}$ overlying the at least one buffer layer;
  wherein Y is at least partially substituted with at least one of: samarium (Sm), ytterbium (Yb), neodymium (Nd), gadolinium (Gd), europium (Eu), lanthanum (La), dysprosium (Dy), holmium (Ho), and mixtures thereof, and wherein x is greater than zero and less than one,
  wherein $J_c$ when a magnetic field is applied perpendicular to the surface of the superconductor is at least about 50% of the $J_c$ that exists when the magnetic field is applied parallel to the surface of the superconductor.

38. A tape-formed oxide superconductor having minimal degradation of $J_c$ when a magnetic field is applied normal to the superconductor's surface, the superconductor comprising:
  a metal tape substrate;
  at least one buffer layer overlying a surface of the metal tape substrate;
  at least one superconducting layer comprising $(YR)_1Ba_2Cu_3O_{7-x}$ overlying the at least one buffer layer;
  wherein Y is at least partially substituted with at least one of: samarium (Sm), ytterbium (Yb), neodymium (Nd), gadolinium (Gd), europium (Eu), lanthanum (La), dysprosium (Dy), holmium (Ho), and mixtures thereof, and wherein x is greater than zero and less than one.
  wherein when a magnetic field is applied perpendicular to a surface of the tape-formed oxide superconductor, the tape-formed oxide superconductor has a $J_c$ that is about 50-90% of the $J_c$ that exists when the magnetic field is applied parallel to the surface of the tape-formed oxide superconductor.

39. A tape-formed oxide superconductor having minimal degradation of $J_c$ when a magnetic field is applied normal to the superconductor's surface, the superconductor comprising:
  a metal tape substrate;
  at least one buffer layer overlying a surface of the metal tape substrate;
  at least one superconducting layer comprising $(YR)_1Ba_2Cu_3O_{7-x}$ overlying the at least one buffer layer;
  wherein Y is at least partially substituted with at least one of: samarium (Sm), ytterbium (Yb), neodymium (Nd), gadolinium (Gd), europium (Eu), lanthanum (La), dysprosium (Dy), holmium, (Ho), and mixtures thereof, and wherein x is greater than zero and less than one.
  wherein, when a magnetic field is applied in any orientation with respect to a surface of the superconductor, the superconductor has a $J_c$ value that is at least about 50% of the $J_c$ that exists when the magnetic field is applied parallel to the surface of the superconductor.

40. The tape-formed oxide superconductor of claim 37, wherein the tape-formed oxide superconductor comprises a drop in $J_c$ of less than a factor of about 7 at a temperature of between about 30K to about 77K, and at a magnetic field of about 1 Tesla, when the magnetic field is applied normal to the surface of the tape-formed oxide superconductor, as compared to a $J_c$ in the presence of no magnetic field.

41. The high temperature superconductor of claim 37, wherein the high temperature superconductor is utilized in at least one of: a power cable, a power transformer, a power generator, and a power grid.

42. The high temperature superconductor of claim 41, wherein the power cable comprises a conduit for passage of a cooling fluid, and wherein the high temperature superconductor is disposed proximate the conduit.

43. The high temperature superconductor of claim 42, wherein the power cable comprises at least one of: a power transmission cable and a power distribution cable.

44. The high temperature superconductor of claim 41, wherein the power transformer comprises one or more windings, wherein at least one winding comprises the high temperature superconductor.

45. The high temperature superconductor of claim 41, wherein the power generator comprises:
- a shaft coupled to a rotor comprising at least one electromagnet comprising one or more rotor coils, and
- a stator comprising a conductive winding surrounding the rotor,
- wherein the conductive winding or at least one of the rotor coils comprises the high temperature superconductor.

46. The high temperature superconductor of claim 41, wherein the power grid comprises:
- a power generation station comprising a power generator;
- a transmission substation comprising at least one power transformer for receiving power from the power generation station, and for stepping-up voltage for transmission;
- at least one power transmission cable for transmitting power from the transmission substation;
- a power substation comprising at least one power transformer for receiving power from the power transmission cables, and for stepping-down voltage for distribution; and
- at least one power distribution cable for distributing power to an end user.

* * * * *

UNITED STATES PATENT AND TRADEMARK OFFICE
CERTIFICATE OF CORRECTION

| | | |
|---|---|---|
| PATENT NO. | : 7,286,032 B2 | Page 1 of 1 |
| APPLICATION NO. | : 10/616719 | |
| DATED | : October 23, 2007 | |
| INVENTOR(S) | : Hee-Gyoun Lee et al. | |

It is certified that error appears in the above-identified patent and that said Letters Patent is hereby corrected as shown below:

Abstract, Change "Jc" to --$J_c$--

Column No. 10, Line No. 66, Claim 2 Change "ytterium" to --ytterium (Y)--

Column No. 12, Line No. 31, Claim 14 Change "ytterium" to --ytterium (Y)--

Column No. 12, Line No. 38, Claim 15 Change "ytterium" to --ytterium (Y)--

Column No. 12, Line No. 62, Claim 16 Change "ytterium" to --ytterium (Y)--

Column No. 14, Line No. 17, Claim 24 Change "winding" to --windings--

Column No. 14, Line No. 60, Claim 27 Change "Less" to --less--

Signed and Sealed this

Twenty-third Day of June, 2009

JOHN DOLL
*Acting Director of the United States Patent and Trademark Office*